US006921710B2

United States Patent
Li et al.

(10) Patent No.: US 6,921,710 B2
(45) Date of Patent: *Jul. 26, 2005

(54) TECHNIQUE FOR HIGH EFFICIENCY METALORGANIC CHEMICAL VAPOR DEPOSITION

(75) Inventors: Weimin Li, Boise, ID (US); Sam Yang, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 10/757,638

(22) Filed: Jan. 13, 2004

(65) Prior Publication Data

US 2004/0147103 A1 Jul. 29, 2004

Related U.S. Application Data

(60) Continuation of application No. 10/234,729, filed on Aug. 30, 2002, now Pat. No. 6,676,756, which is a division of application No. 09/945,567, filed on Aug. 30, 2001, now Pat. No. 6,576,538.

(51) Int. Cl.⁷ .............................................. H10L 21/20
(52) U.S. Cl. ...................... 438/584; 438/597; 438/680; 438/681; 438/686
(58) Field of Search .............................. 438/584, 597, 438/680, 681, 686

(56) References Cited

U.S. PATENT DOCUMENTS

| 5,104,684 | A | * | 4/1992 | Tao et al. ..................... 427/526 |
| 5,130,172 | A | | 7/1992 | Hicks et al. |
| 5,204,314 | A | * | 4/1993 | Kirlin et al. ................ 505/447 |
| 5,322,712 | A | * | 6/1994 | Norman et al. ............. 427/250 |
| 5,403,620 | A | * | 4/1995 | Kaesz et al. ................ 427/252 |
| 5,552,327 | A | | 9/1996 | Bachmann et al. |
| 5,576,071 | A | | 11/1996 | Sandhu |
| 5,672,385 | A | | 9/1997 | Jimba et al. |
| 5,763,007 | A | | 6/1998 | Weiller |
| 5,783,716 | A | | 7/1998 | Baum et al. |
| 5,789,027 | A | * | 8/1998 | Watkins et al. .............. 427/250 |
| 5,902,651 | A | | 5/1999 | Westmoreland et al. |
| 5,990,559 | A | * | 11/1999 | Marsh ......................... 257/768 |
| 6,010,744 | A | * | 1/2000 | Buskirk et al. ................ 427/81 |
| 6,140,230 | A | | 10/2000 | Li |
| 6,146,608 | A | * | 11/2000 | Todd et al. .................. 423/249 |
| 6,162,712 | A | * | 12/2000 | Baum et al. ................. 438/580 |
| 6,180,974 | B1 | | 1/2001 | Okutoh et al. |
| 6,201,271 | B1 | | 3/2001 | Okutoh et al. |
| 6,204,172 | B1 | * | 3/2001 | Marsh ......................... 438/653 |
| 6,210,745 | B1 | * | 4/2001 | Gaughan et al. ............... 427/8 |
| 6,271,131 | B1 | | 8/2001 | Uhlenbrock et al. |
| 6,329,286 | B1 | * | 12/2001 | Vaartstra ..................... 438/650 |
| 6,403,414 | B2 | | 6/2002 | Marsh |
| 6,475,854 | B2 | | 11/2002 | Narwankar et al. |
| 6,576,538 | B2 | * | 6/2003 | Li et al. ...................... 438/597 |

(Continued)

OTHER PUBLICATIONS

Irving, Optical Diagnostics for Thin Film Processing, Academic Press, 1996, p. 29.

Primary Examiner—Olik Chaudhuri
Assistant Examiner—Michael K. Luhrs
(74) Attorney, Agent, or Firm—Knobbe Martens Olson & Bear LLP

(57) ABSTRACT

A technique for more efficiently forming conductive elements, such as conductive layers and electrodes, using chemical vapor deposition. A conductive precursor gas, such as a platinum precursor gas, having organic compounds to improve step coverage is introduced into a chemical vapor deposition chamber. A reactant is also introduced into the chamber that reacts with residue organic compounds on the conductive element so as to remove the organic compounds from the nucleating sites to thereby permit more efficient subsequent chemical vapor deposition of conductive elements.

9 Claims, 6 Drawing Sheets

U.S. PATENT DOCUMENTS

| | | | |
|---|---|---|---|
| 6,605,735 B2 * | 8/2003 | Kawano et al. | 556/136 |
| 6,689,700 B1 * | 2/2004 | Watkins et al. | 438/762 |
| 2001/0000865 A1 | 5/2001 | Gaughen et al. | |
| 2001/0043453 A1 | 11/2001 | Narwankar et al. | |
| 2001/0044207 A1 | 11/2001 | Marsh | |
| 2002/0076492 A1 | 6/2002 | Loan et al. | |
| 2003/0100183 A1 * | 5/2003 | Li et al. | 438/681 |

* cited by examiner

Pt CVD precursor (methylcyclopentadienyl)(trimethyl)platinum colorless crystalline – m.p. 30 C
v.p. 0.053 Torr @ 23 C

TECHNIQUE FOR HIGH EFFICIENCY METALORGANIC CHEMICAL VAPOR DEPOSITION

This is a continuation application of U.S. patent application Ser. No. 10/234,729, filed Aug. 30, 2002, now U.S. Pat. No. 6,676,756, which was a divisional application of U.S. patent application Ser. No. 09/945,567 which was filed Aug. 30, 2001, now U.S. Pat. No. 6,576,538 which are hereby incorporated by reference herein.

BACKGROUND OF THE INVENTION

1. Field of the Invention

The present invention relates to semiconductor processing and, in particular, concerns a metalorganic chemical vapor deposition (MOCVD) technique for forming component layers, such as platinum layers, in a manner that results in more efficient deposition of the component layer onto the surface of a semiconductor device.

2. Description of the Related Art

Semiconductor processing techniques have become increasingly more complex as a result of the increasing density and smaller sizes of semiconductor devices. One particular problem that occurs with smaller sized semiconductor devices is that it is often difficult to form components, such as conductors, vias and electrodes, that conformally cover the contours of the semiconductor device. For example, a typical device formed by semiconductor processing is a capacitor. Typically, a capacitor is formed in an opening in an isolation layer of a semiconductor device and has two electrodes that are positioned within the opening with a dielectric separating the electrodes so as to cover both the side walls and the bottom floor of the opening. It will be appreciated that as the openings become smaller and smaller in size, it is increasingly more difficult to have the electrode formed so as to uniformly cover the side walls and bottom walls of the opening. Three dimensional capacitors are but one example of a device that is increasingly more difficult to fabricate due to decreasing device dimensions leading to difficulties with conformal covering of the device surface. Other devices in which this problem occurs include vias, electrodes and conductive lines.

To address the particular problems associated with forming electrodes and other conductive elements on 3-dimensional surfaces, various techniques using various materials have been developed. One particularly common technique for forming three dimensional conductive elements, vias and lines in semiconductor applications is to use Chemical Vapor Deposition (CVD) techniques to deposit a conductive material, such as platinum (Pt), within an opening formed to contain a 3-dimensional conductive element.

For example, platinum is viewed as an ideal electrode material for high-K capacitors in DRAM applications due to its relatively high work function. This high work function forms an increased energy barrier inhibiting leakage migration of charge carriers between electrodes through an intervening dielectric. Moreover, platinum is also generally not oxidizable such that the electrode's resistivity is not increased as a result of exposure to oxygen containing compounds contained within the semiconductor environment.

Further, platinum is also strongly favored for formation of electrodes and 3-dimensional semiconductor structures, such as capacitors, conductors, vias and the like, due to its particularly advantageous step coverage when applied using chemical vapor deposition (CVD) techniques. In particular, platinum can be used to coat 3-dimensional structures through chemical vapor deposition such that the vertical side walls and the horizontal bottom surfaces are adequately covered by the deposited platinum.

Typically, a platinum precursor and other reactants are introduced into the CVD chamber and the platinum carried by a precursor gas is then deposited onto the surface of the semiconductor substrate through thermal decomposition or reaction with another reactant gas, such as $O_2$, $N_2O$, or $H_2$. The platinum is carried in the precursor gas, that often comprises an organic compound. The platinum atom is bonded to the organic compound to permit the platinum atoms to be transferred in the gas phase. This enables the Pt to be conformally deposited over the surface of the wafer as the organic compound facilitates improved step coverage.

In the prior art, there is generally only a single deposition step such that the precursor gas and other reactant gas(es) are flowed into the CVD chamber until enough platinum, carried by the precursor gas, has been deposited on the exposed surface to form an electrode or other conductive element of a desired thickness. However, current CVD platinum deposition techniques have particularly low deposition efficiency such that the deposition rate is very slow, on the order of 1 Angstrom per second. In order to obtain a 300 Angstrom film, the deposition time is therefore usually several minutes. The relatively slow deposition rate creates inefficiencies in the manufacturing of semiconductor devices.

Moreover, the platinum precursor gas used for deposition is particularly expensive, on the order of $100 per gram. It has been observed that typical CVD platinum deposition techniques result in enormous waste of this expensive platinum precursor gas as only a small proportion of the platinum carried by the precursor gas is actually being deposited on the semiconductor wafer positioned in the CVD chamber. Hence, not only are current CVD platinum deposition techniques slow, they are also particularly inefficient in delivering platinum to the wafer. This results in considerable waste of expensive material and increases the cost of manufacturing semiconductor devices that require 3-dimensional conductive structures, like electrodes or conductors.

Further, the deposition process also results in the possible deposition of hydrocarbon byproducts on the surface of the semiconductor device which can become incorporated into or adsorbed onto the surface of the deposited film contaminating the film and inhibiting further deposition. In particular, the deposition of platinum in one typical process proceeds by the formula:

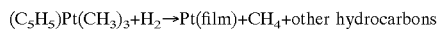

$(C_5H_5)Pt(CH_3)_3 + H_2 \rightarrow Pt(\text{film}) + CH_4 + \text{other hydrocarbons}$ The other hydrocarbons may not be volatile enough at the deposition temperature and thus stay on the surface of the film following deposition. This can result in contamination of the film and inhibit further deposition of the platinum film.

From the foregoing, it will be appreciated that there is a need for an improved technique for depositing conductive materials onto a semiconductor surface such that good step coverage can be obtained without a significant increase in the cost of manufacturing the semiconductor device. To this end, there is a need for a more efficient way of depositing conductive material, such as platinum, in a manner that results in more efficient deposition of the material with less waste of the precursor material used to form the material.

SUMMARY OF THE INVENTION

The aforementioned needs are satisfied by the present invention which, in one aspect, comprises a method of forming a conductive layer comprising (a) positioning a semiconductor device within a CVD chamber, (b) exposing the semiconductor device to a precursor gas containing a conductive element and a reactant to form the conductive layer for a first period of time, (c) exposing the semiconductor substrate to a reactant so that the reactant reacts with organic compounds contained within the conductive layer, and (d) reintroducing the precursor gas into the CVD chamber following exposure of the semiconductor substrate to the reactant so as to further form the conductive layer on the semiconductor device.

In one particular embodiment, a semiconductor device with a defined opening for a 3-dimensional capacitor is positioned within a CVD chamber and is exposed to a precursor gas containing platinum which is then deposited using chemical vapor deposition techniques. A reactant is also introduced into the CVD chamber wherein the deposited platinum material is exposed to the reactant. The reactant can comprise any of a number of elements, compounds or processes, such as, for example, the introduction of a gas such as $H_2$, $N_2O$, NO, $H_2O$, $O_2$, ozone, or some other oxygen containing ambient, into the CVD chamber or with the enhancement of plasma or UV light. Moreover, the conductor can comprise not only platinum, but also other conductive films such as Ir, Rh, Ni, Co, Cu, W, and the like.

In one embodiment, the reactant gas is introduced at the same time as the conductive precursor gas. In another embodiment, the reactant gas is introduced following the introduction of the precursor gas for a selected period of time. In either circumstance, the reactant gas reacts with the residual organic compounds so as to remove the residual organic compounds in or on the surface of the deposited films thereby increasing the deposition efficiency.

Organic by-products can be adhered to the exposed surface of the deposited conductive layer. By introducing a reactant into the CVD chamber, the organic compounds can be removed by reaction with the reactants thereby making available more conductor nucleating sites and allowing greater absorption of the conductor precursor in the vapor phase.

In another aspect of the invention, a system for forming a conductive layer on a semiconductor device is provided. In this aspect, the system includes a CVD chamber which receives the semiconductor device; a metal organic precursor gas source which provides a metal organic precursor gas with entrained conductive particles; a reactant source that provides a reactant to the CVD chamber and a controller which controls the delivery of conductive precursor gas and reactant into the CVD chamber. In this aspect, the controller allows for the delivery of the conductive precursor gas and the reactant into the chamber. The reactant is selected to react with organic compounds of the conductive precursor gas so as to remove the organic compound from the formed conductive layer. Hence, by delivering both the precursor and the reactant, either simultaneously or sequentially or both, the efficiency of the deposition process can be improved.

In one particular embodiment, the system includes a sensor, such as, for example, a mass spectrometer, that provides a signal to the controller indicative of the deposition of the conductive precursor gas by the semiconductor device. When the deposition drops below a particular threshold, such that there is increased waste of the conductive precursor gas, the controller then induces the delivery of the reactant into the chamber.

It will be appreciated that the aforementioned aspects of the present invention allow for more efficient formation of conductive layers with more efficient deposition of conductive material at a greater cost saving. These and other objects and advantages of the present invention will become more fully apparent from the following description taken in conjunction with the accompanying drawings.

DETAILED DESCRIPTION OF THE PREFERRED EMBODIMENT

Figure 1:
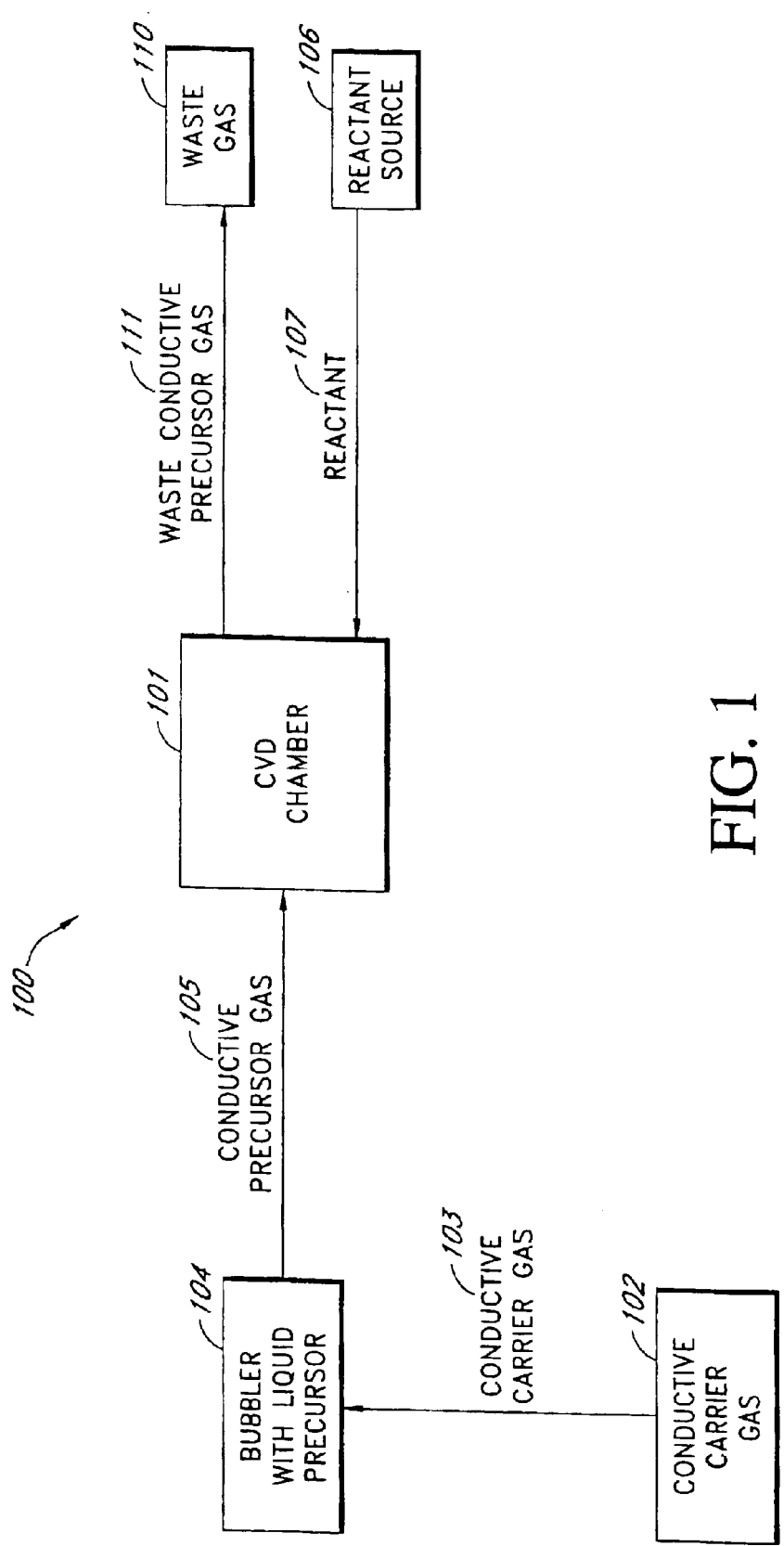
FIG. 1 is a block diagram of one embodiment of a system for forming a conductive structure on a semiconductor device.

Reference will now be made to the drawings wherein like numerals refer to like parts throughout. FIG. 1 is a block diagram which illustrates one example of a system 100 for depositing a conductive layer on a semiconductor device in accordance with the illustrated embodiment. As is illustrated in FIG. 1, a CVD chamber 101 of a type known in the art, is provided with a conductive precursor gas 105 that is used to deposit conductive layers and structures on semiconductor devices positioned within the CVD chamber 101. In particular, a conductive carrier gas 103 containing conductive elements is provided by a conductive carrier gas source 102 and the conductive carrier gas 103 is supplied to a bubbler 104 that contains a liquid precursor. The conductive carrier gas 103 and the liquid precursor bind so as to allow the conductive element to be carried in a gas form in the conductive precursor gas 105 into the CVD chamber 101 so as to permit CVD coverage of the semiconductor devices in a manner known in the art.

In one particular embodiment, the conductive carrier gas 103 is a known platinum-based carrier gas, such as platinum entrained in $N_2O$. The conductive carrier gas 103 is supplied to the bubbler 104 which, in this embodiment, contains a liquid methyl based precursor such that the conductive precursor gas 105 is comprised of (methylcyclopentadienyl) (trimethyl) platinum (MeCpPtMe$_3$). The use of the organic methyl compound in the conductive precursor gas 105 allows for better step coverage during CVD deposition than just supplying a platinum carrier gas directly into the CVD chamber 101. As will be described in greater detail below, in one embodiment, the conductor precursor gas 105 is supplied to the CVD chamber 101 for a preselected period of time so as to allow the conductive element to coat the semiconductor device via chemical vapor deposition (CVD) techniques.

While in this embodiment, the conductive precursor gas 105 is a Platinum conductive gas, it will be appreciated that any of a number of different precursor gases used to form conductive films can be used without departing from the present invention. These gases include gases that entrain conductive elements such as Ir, Rh, Ni, Co, Cu, W, and the like.

As is also illustrated in FIG. 1, the system 100 includes a reactant source 106 that provides a reactant 107 into the CVD chamber 101 that is selected so as to interact with the organic compounds of the conductive precursor gas 105 to thereby facilitate more efficient deposition of the conductive elements contained within the conductive precursor gas 105. In one particular embodiment, the reactant source 106 provides the reactant 107 selected from the group comprising $NH_3$, $H_2$, $N_2$, NO, $N_2O$, $O_2$, $O_3$, or any other O containing ambient. Providing the reactant 107 into the CVD chamber 101 allows the conductive elements contained within the conductive precursor gas 105 to deposit on the surface of the semiconductor device. Providing the reactant 107 into the CVD chamber 101, also results in the reactant 107 reacting with residual organic compounds or other contaminants from the conductive precursor gas 105 that have been deposited on the conductive structure formed during the CVD step thereby allowing for more efficient deposition of conductive elements during subsequent chemical vapor deposition steps. As is also illustrated in FIG. 1, the illustrated system 100 also includes a waste gas receptacle 110 that receives waste gas 111 comprised of unused conductive precursor gas 105 and unused reactants 107 during the process.

In the preferred process, the reactant 107 and the conductive precursor gas 105 are simultaneously introduced into the CVD chamber 101 for a period of time that is selected to obtain a resulting conductive film of a desired thickness. When both the reactant 107 and the conductive precursor gas 105 are introduced into the chamber 101, the reactant 107 reacts with the contaminants contained within the film that may not otherwise be volatile enough at the deposition temperature and stay on the surface.

In one embodiment, the reactant 107 is an oxidizing agent, such as NO, $N_2O$, $O_2$, or $O_3$, that reacts with the organic byproducts on the surface to give them sufficient energy to become a gas that can be removed as the waste gas 111. In other embodiments, the reactant 107 is a reducing agent such as $NH_3$ or $H_2$. In the specific application of using platinum, platinum is an active catalyst that absorbs hydrogen at its surface and it activates the molecules enough to react with carbon or methyl ($CH_3$) to form $CH_4$ and other hydrocarbons. The introduction of the reactant 107 helps to remove these other hydrocarbons.

In the preferred embodiment, the reactant 107 and the conductive precursor gas 105 are introduced into the chamber 101 simultaneously until a film of a desired thickness is achieved. It will, however, be appreciated that the precursor gas 105 and the reactant gas 107 can be introduced sequentially until a film of a desired thickness is achieved without departing from the spirit of the present invention. It should be appreciated that introduced should be construed to mean both initiating the supply of an agent and also continuing to supply that agent for some period of time.

Figure 2A:
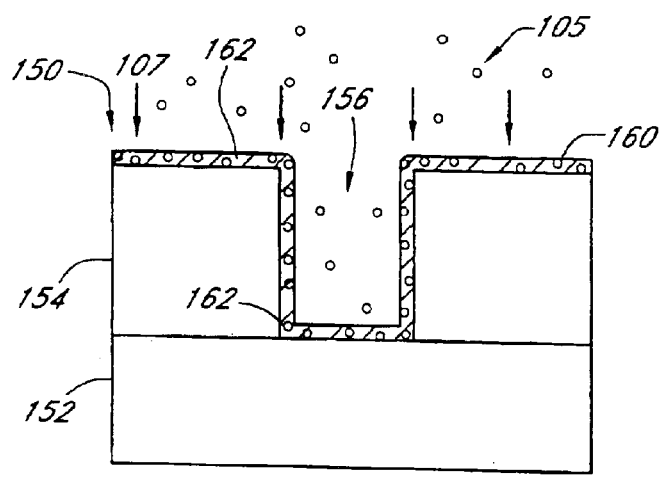
FIGS. 2A–2C are cross-sectional views of a semiconductor device illustrating one embodiment of a method by which a conductive structure is formed on the device.
Figure 2B:
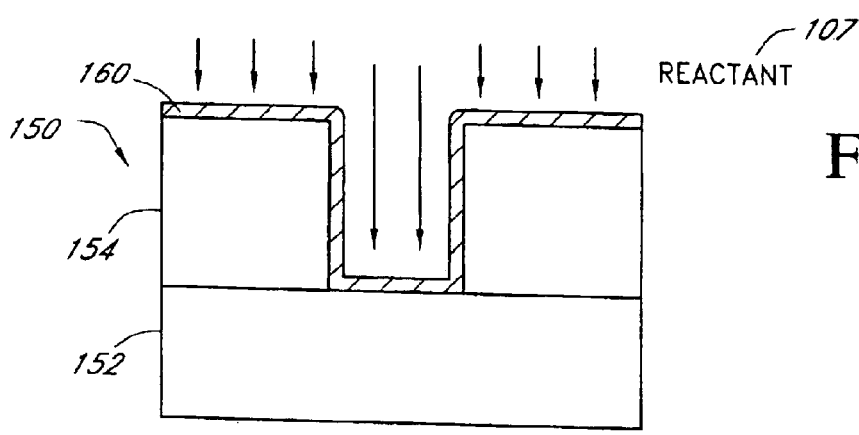
Figure 2C:
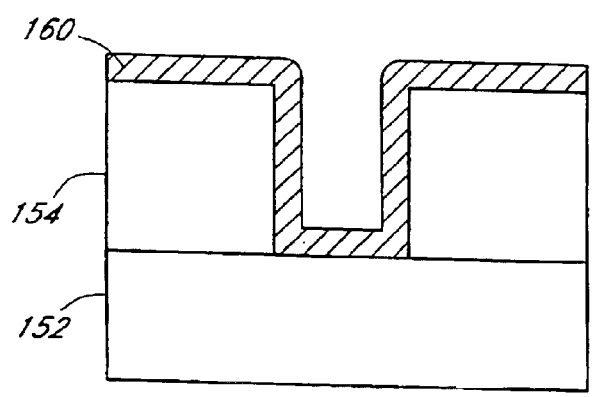

FIGS. 2A–2C schematically illustrate the process of the illustrated embodiment in greater detail. More particularly, FIGS. 2A–2C provide a simplified illustration of how a conductive layer 160, such as a lower electrode of a capacitor or a conductive, would be formed in an opening 156 that is adapted to receive, for example, a capacitor. As is illustrated in FIG. 2A, a semiconductor device 150, which can comprise a semiconductor substrate 152 with an insulating layer 154 positioned thereon, is positioned within the CVD chamber 101. In this particular simplified example, the semiconductor device 150 includes the opening 156 formed in the insulating layer 154 which is then to be coated with the conductive layer 160.

As is illustrated in FIG. 2A, the conductive precursor gas 105 is introduced into the CVD chamber 101 such that a conductive material, such as platinum, is deposited on the exposed surfaces of the semiconductor device 150. Using the conductive precursor gas 105 illustrated in FIG. 4 results in a relatively high degree of step coverage of the conductive layer 160 on the horizontal surfaces and also on the vertical side wall surfaces of the semiconductor device 150. As is also schematically represented in FIG. 2A, the initial deposition of the conductive layer 160 results in organic compounds 162 occupying the surface nucleating sites of the conductive layer 160. In particular, for the conductive precursor gas 105 illustrated in FIG. 3A, the organic compound 162 that comprises the methyl molecules poisons the exposed surface of the conductive layer 160 by covering the available platinum nucleating sites or by otherwise inhibiting further absorption of the conductive precursor gas 105 in the vapor phase.

Figure 3A:
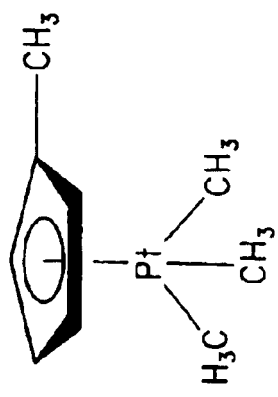
FIG. 3A is an illustration of a typical platinum precursor gas molecule used in a CVD process.
Figure 3B:
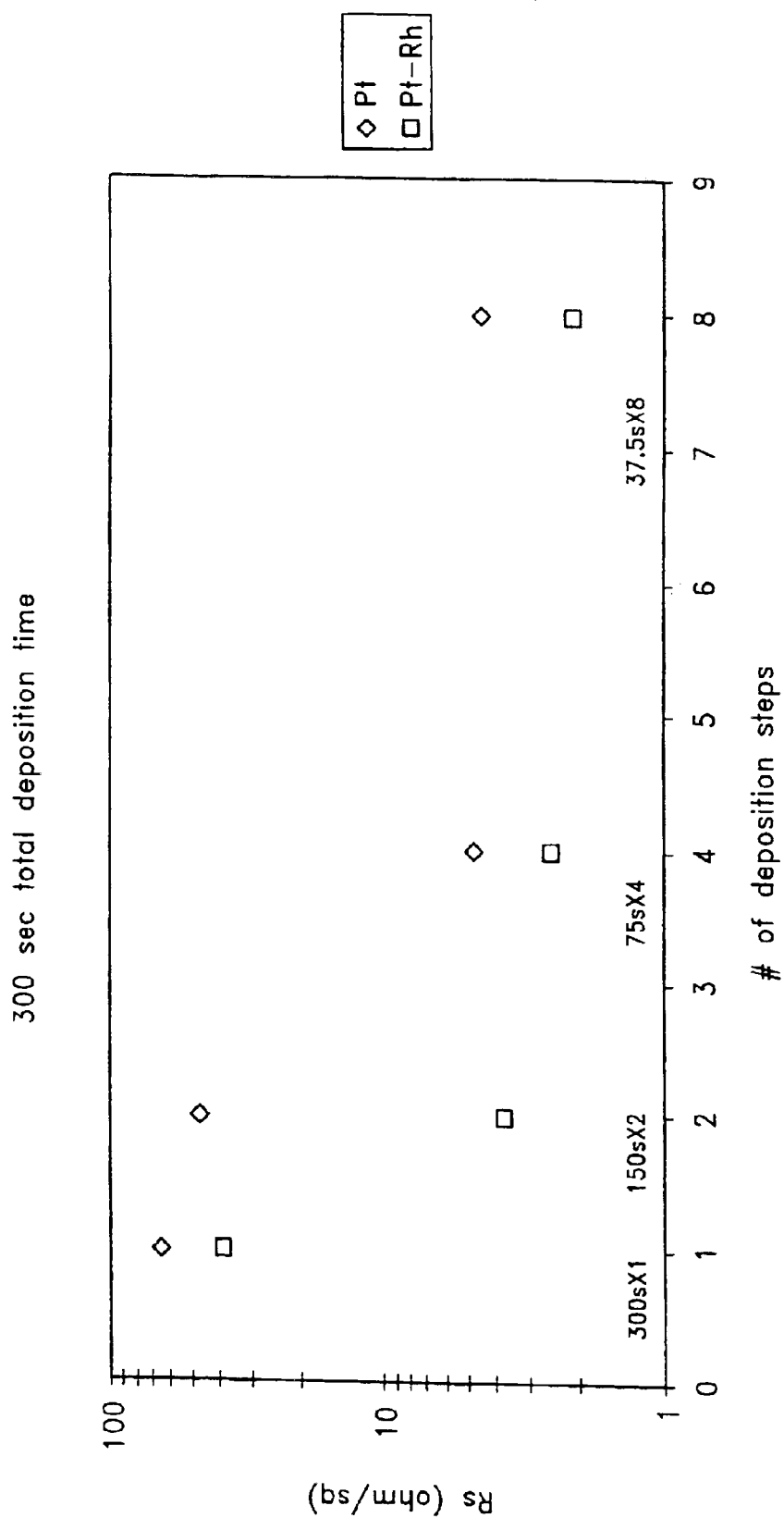
FIG. 3B is a chart illustrating the improved absorption characteristics of the process of the illustrated embodiments.

As is also schematically illustrated in FIG. 2A, the reactant 107 is introduced into the CVD chamber 101 as the conductive precursor gas 105. The reactant 107 preferably reacts with the organic compounds 162 thereby removing these compounds in the previously described manner to improve the deposition efficiency of the process. The process illustrated in FIG. 2A can thus be continued until a conductive layer 160 of a desired thickness is achieved. The simultaneous introduction of the conductive precursor gas 105 and the reactant 107 results in more efficient deposition as is illustrated in the chart of FIG. 3B discussed hereinbelow.

As was also discussed above, the reactant 107 can also be introduced after the conductive precursor gas 105 has been introduced for a set period of time in the manner shown in FIG. 2B. Specifically, the conductive precursor gas 105 can be initially introduced and the reactant 107 can then be introduced subsequently to remove the contaminants 162 and the conductive precursor gas 105 can then be reintroduced again.

For example, once the conductive layer 160 is no longer efficiently absorbing the conductive elements of the conductive precursor gas 105, the flow of the conductive precursor gas 105 into the CVD chamber 101 is stopped and the semiconductor device 150 within the CVD chamber 101 is then exposed to a reactant 107 from the reactant source 106. Preferably, the reactant source 106 is selected to provide a reactant 107 that reacts with the organic compounds 162 of the conductive precursor gas 105 so as to remove at least some of the organic compounds 162 from conductive element nucleation sites within the conductive layer 160. In certain embodiments, the reactant 107, as introduced subsequent to cessation of introduction of the conductive precursor gas 105, comprises a reactant 107 selected from the group comprising $N_2O$, $O_2$, $H_2$, $NH_3$, NO, $H_2O$, ozone, vacuum, and inert gas purge, such as with $N_2$ or argon. In certain embodiments, the reactant 107 also comprises providing supplemental plasma treatment and/or UV light to the CVD chamber 101.

It will be appreciated that in certain embodiments, the reactant 107 as introduced with the conductive precursor gas 105 comprises the same reactant 107 as introduced absent the introduction of the conductive precursor gas 105. In other embodiments, the reactant 107 as introduced absent the introduction of the conductive precursor gas 105 comprises alternative or additional components as the reactant 107 as introduced with the conductive precursor gas 105.

As illustrated in FIG. 2C, subsequent to the exposure of the conductive layer 160 to the reactant 107, the reactant source 106 stops providing the reactant 107 into the CVD chamber 101 and the conductive precursor gas 105 is again provided into the CVD chamber 101 in the previously described manner. This results in further deposition of the conductive elements contained within the conductive precursor gas 105 so as to result in greater deposition of the conductive elements. Since the reactant 107 has removed at least some of the organic compounds 162 from the conductive layer 160 that would otherwise inhibit further chemical vapor deposition of the conductive elements of the conductive precursor gas 105, more conductive elements can be added to the conductive layer 160 by a subsequent chemical vapor deposition step.

Hence, the process of forming the conductive layer 160 in this embodiment can either comprise introducing a conductive precursor gas 105 and a reactant 107 simultaneously into the CVD chamber 101 for a preselected period of time to form a conductive structure or sequentially introducing a conductive precursor gas 105 and a reactant 107 to form the conductive structure 160.

In one particular example, a conductive layer 160 is formed using an initial deposition step wherein a platinum precursor carrier gas is provided from the conductive carrier gas source 102 through the bubbler 104 at a rate of between 40 to 200 sccm with the platinum being encapsulated within a helium carrier. The bubbler 104 contains a liquid precursor at a temperature between 35° C. and 50° C., such that the resulting conductive precursor gas 105 emanating from the bubbler 104 has the chemical composition as illustrated in FIG. 3A. The resulting conductive precursor gas 105 is provided from the bubbler 104 to the CVD chamber 101 along with a simultaneous flow of $N_2O$ reactant 107 at a rate of 100 to 800 sccm from the reactant source 106. This flow of conductive precursor gas 105 and reactant 107 is provided to the CVD chamber 101 for approximately 50 seconds to result in deposition of the conductive layer 160. At the end of the 50 second period, the flow of the conductive precursor gas 105 from the bubbler 104 is ceased while the flow of the $N_2O$ reactant 107 from the reactant source 106 is continued for 10 seconds. The $N_2O$ thus comprises the reactant 107 which reacts with the organic compounds 162 in the deposited layer 160 associated with the conductive precursor gas 105 so as to remove the organic compounds 162 from the deposited, conductive layer 160 in the manner described in conjunction with FIG. 2B.

Subsequently, the conductive precursor gas 105 is provided for another 50 second interval and is then followed by a 10 second exposure of the conductive layer 160 to the $N_2O$ reactant 107 from the reactant source 106. This process is repeated until a conductive layer 160 of a desired thickness is formed.

Repeating the above-described exemplary process for three iterations results in the deposition of a platinum conductive layer 160 that has a resistivity of approximately 1.1 Ohm/sq. With the same processing parameters and devices, a single step CVD deposition that does not include either simultaneous or sequential introduction of reactant 107 for the same overall duration results in a conductive layer having a resistivity on the order of 17 Ohm/sq.

It will be understood that resistivity of the deposited conductive layer 160 is inversely proportional to the thickness of the conductive layer 160 which indicates that there is a very significant increase in the deposition rate of the film using the process of the above-described embodiment. In fact, the Applicant has observed at least ten-fold increases in the deposition rate over known CVD deposition techniques for conductive layers of this type. Hence, there is a significant savings both in terms of reduced waste of the conductive precursor gas 105 and also reduced processing time to form conductive layers 160 of a desired thickness using the CVD deposition technique 100 described herein.

FIG. 3B is a diagram which illustrates the advantages of using both a conductive precursor gas 105 and a reactant gas 107 in forming conductive layers 160. FIG. 3B is a chart that is illustrative of the Resistivity (Rs) of films of either Pt or PtRh with multiple deposition steps. The total deposition time for the process illustrated in FIG. 3B is 300 seconds where the conductive precursor gas 105 is introduced for 50 seconds in combination with the reactant 107 and then for 10 seconds the reactant 107 is maintained by itself in the chamber 101. As is illustrated, there is a significant decrease in the resistivity which is indicative of an increase in the thickness of the film as compared to a single step, 300 second deposition without the introduction of a reactant 107.

In the specific example described above, the conductive precursor gas 105 is introduced simultaneously with the reactant 107 and then the reactant 107 is introduced for a limited period of time by itself to improve the deposition rate of the process. It will be appreciated that the system can either have the combined conductive precursor gas 105/reactant 107 introduced for a selected time period followed by introduction of the reactant 107 alone for a selected time period or the system can monitor the rate of absorption of the conductive precursor gas 105 and, when it falls below a desired threshold, increase the concentration or change the composition of the reactant 107 which can then be followed by reintroduction of the conductive precursor gas 105.

Figure 4:
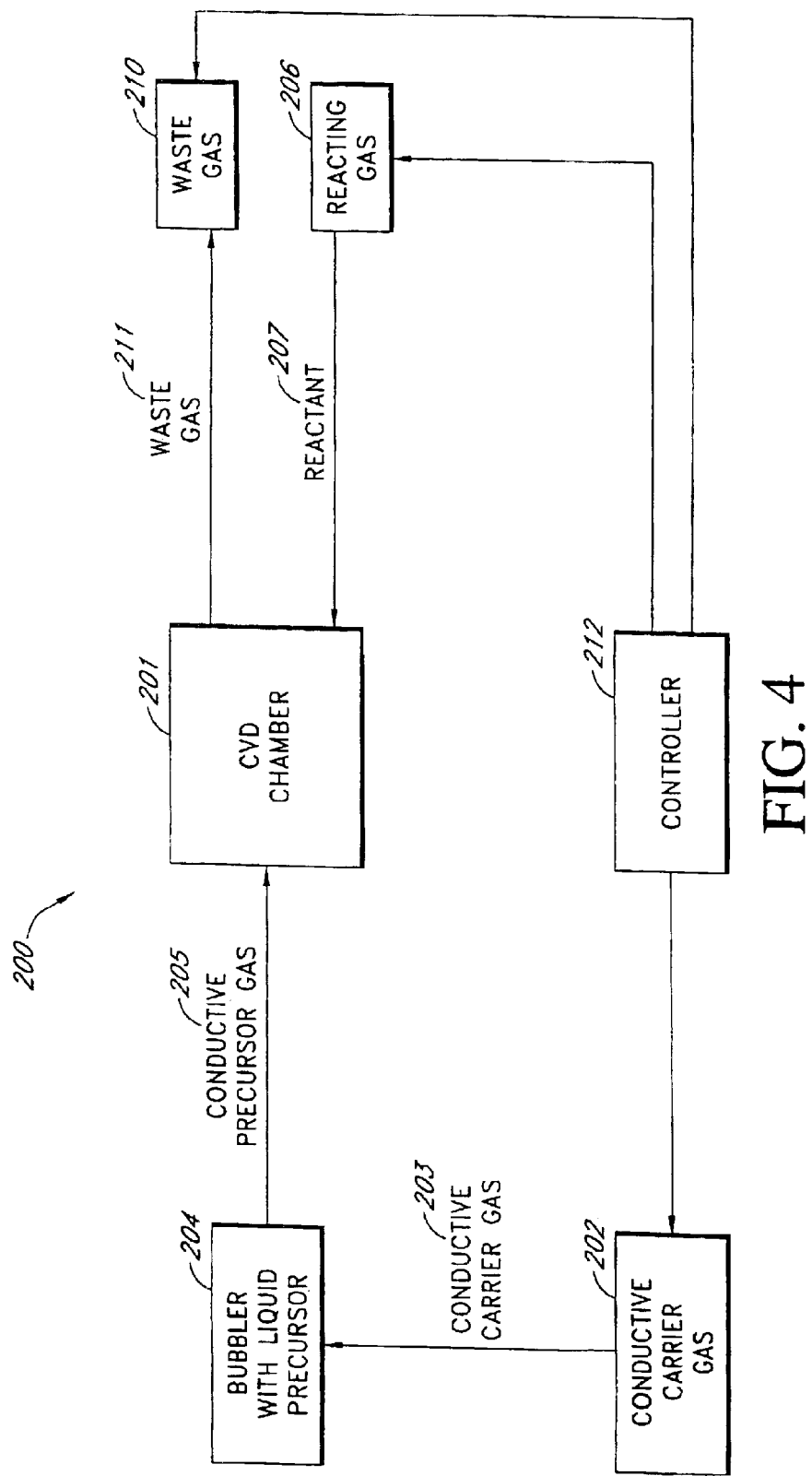
FIG. 4 is a block diagram illustrating another embodiment of a system for forming a conductive structure on a semiconductor device.

For example, as is illustrated in FIG. 4, a CVD system 200 includes a CVD chamber 201 that receives the conductor precursor gas 205 from a bubbler 204 wherein the bubbler 204 is supplied with the conductive carrier gas 203 from the conductive carrier gas source 202 in the previously described manner. Similarly, the reactant 207 is introduced into the CVD chamber 201 from a reactant source 206 and waste gas 211 is supplied to a waste gas receptacle 210 in the previously described manner. A controller 212, such as a microprocessor, controls the operation of the CVD system 200. Moreover, the controller 212 receives a signal from the waste gas receptacle 210 that is indicative of the quantity of the conductive precursor gas 205 that is not being deposited onto or absorbed by the conductive layer 160 of the semiconductor device 150 and is, thus, being received by the waste gas receptacle 210. For example, a mass spectrometer can be installed in the waste gas receptacle 210 so as to provide an indication of the quantity of the conductive precursor gas 205 that is not being deposited onto the conductive layer 160. This signal can then be used by the controller 212 to determine when to deliver the reactant 107 into the CVD chamber 201. The signal can also be used to determine the appropriate composition of the reactant(s) 107 to be supplied to the CVD chamber 201.

Figure 5:
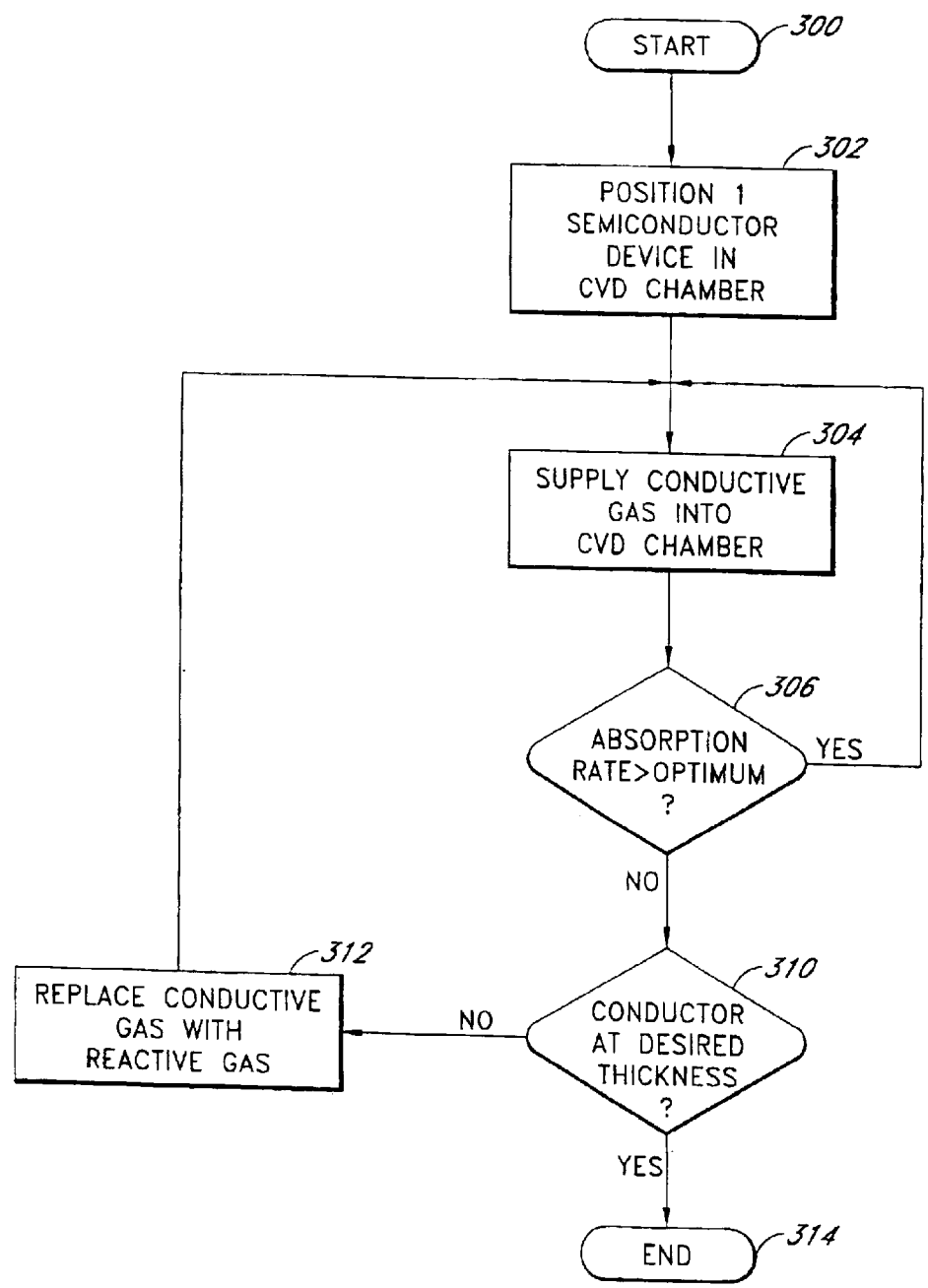
FIG. 5 is a flow chart illustrating one method of forming a conductive structure on a semiconductor device.

FIG. 5 is a flow chart illustrating an exemplary manner of operation of the CVD system 200 of FIG. 4. From a start state 300 the semiconductive device 150 is initially positioned, in state 302, within the CVD chamber 201. Subsequently, the conductive precursor gas 105 is introduced, in state 304, into the CVD chamber 201. The conductive precursor gas 105 can be introduced in state 304 alone or in combination with the reactant 107 as discussed previously.

The controller 212 can then determine, in decision state 306, whether the absorption rate, indicative of the proportion of the conductive precursor gas 105 being deposited to form the conductive layer 160, is above a preselected absorption rate. This determination can be based upon analysis of the conductive precursor gas 105 being received by the waste gas receptacle 210 as described above.

If the controller 212 determines, in decision state 306, that the absorption rate is above a preselected threshold, the conductive precursor gas 105 continues to be supplied into the CVD chamber 201 in state 304. However, if the controller 212 determines, in decision state 306, that the absorption rate has decreased below the preselected threshold, the controller 212 then determines, in decision state 310, whether the conductive layer 160 is at a desired thickness. The controller 212 can, for example, make this determination by comparing the elapsed time of the deposition cycle to empirically determined deposition rates for the particular conductive precursor gas 105. If the controller 212 determines, in decision state 310, that the thickness of the conductive layer 160 is the desired thickness, the process then proceeds to an end state 314 allowing the semiconductor device 150 to be removed from the CVD chamber 201. It will be appreciated that it may be desirable to introduce the reactant 107 into the CVD chamber 201 prior to removal of the semiconductor device 150 from the CVD chamber 201 so as to remove at least some of the organic compounds 162 prior to a subsequent processing step.

However, if the absorption rate has dropped below the optimum and the conductive layer 160 is not at the desired thickness, the controller 212 can, in state 312, then cease delivery of the conductive precursor gas 105 into the CVD chamber 201 and provide only the reactant 107 into the CVD chamber 201 for a predetermined period of time to enhance the removal of the organic compounds 162 in the conductive layer 160. Subsequently, the conductive precursor gas 105 can be reintroduced into the CVD chamber 201, in state 304, for a subsequent deposition of the conductive layer 160. In this way, intelligent control of the CVD system 200 can be obtained thereby resulting in more efficient chemical vapor deposition of conductive layers 160 and structures onto the semiconductor device 150.

From the foregoing, it will be appreciated that the above-described process illustrates a manner of forming a conductive layer 160 or structure on a semiconductor device 150 that results in more efficient use of conductive precursor gas 105. This results in significantly less waste of the conductive precursor gas 105 resulting in cost savings for the manufacturing process. Moreover, the improved efficiencies can also result in faster formation of the conductive layers 160 resulting in improved manufacturing efficiencies.

Although the foregoing description of the preferred embodiment of the present invention has shown, described and pointed out the fundamental novel features of the invention, it will be understood that various omissions, substitutions and changes in the form of the detail of the apparatus as illustrated as well as the uses thereof, may be made by those skilled in the art without departing from the spirit of the present invention. Consequently, the scope of the present invention should not be limited to the foregoing discussions, but should be defined by the appended claims.

What is claimed is:

1. A method of forming a platinum conductive layer on a semiconductor device, the method comprising:
   (i) positioning the semiconductor device within a chemical vapor deposition chamber;
   (ii) introducing a platinum precursor gas into the chemical vapor deposition chamber for a first period of time so as to deposit a platinum conductive layer on the device;
   (iii) introducing a reactant into the chemical vapor deposition chamber for a second period of time, so that organic waste compounds contacting the platinum conductive layer are removed to thereby facilitate subsequent deposition of the platinum conductive layer; and
   (iv) continuing acts (ii) and (iii) until the conductive layer of a desired thickness is achieved;
   (v) monitoring the rate of deposition of the platinum layer;
   (vi) determining when the rate of deposition has decreased below a desired threshold;
   (vii) halting the supply of platinum precursor gas upon determining that the rate of deposition is less than the desired threshold; and
   (viii) providing the reactant after halting the supply of the platinum precursor gas.

2. The method of claim 1, wherein introducing the platinum precursor gas into the chemical vapor deposition chamber comprises introducing a platinum precursor gas into the chemical vapor deposition chamber wherein the platinum is bonded to a methyl compound so as to improve the step coverage of the platinum precursor gas when forming the conductive layer.

3. The method of claim 2, wherein introducing the platinum precursor gas comprises introducing a (methylcyclopentadienyl(trimethyl) platinum gas into the chemical vapor deposition chamber.

4. The method of claim 1, wherein introducing the reactant into the chemical vapor deposition chamber comprises introducing the reactant both simultaneously with the platinum precursor gas and sequentially to the platinum precursor gas.

5. The method of claim 4, wherein the reactant is a reducing agent.

6. The method of claim 4, wherein the reactant is an oxidizing agent.

7. The method of claim 4, wherein introducing the reactant comprises introducing a reactant selected from the group comprising $N_2O$, $O_2$, $NH_3$, $NO$, $H_2O$ and ozone.

8. The method of claim 1, wherein monitoring the rate of deposition of the platinum layer comprising monitoring the amount of platinum components in the platinum precursor gas that arrives at a waste receptacle following introduction of the platinum precursor gas into the chemical vapor deposition chamber.

9. The method of claim 8, wherein monitoring the amount of platinum components in the platinum precursor gas that arrives at a waste receptacle comprises using a mass spectrometer to obtain a measurement indicative of the amount of platinum components of the platinum precursor gas that arrives at the waste receptacle.

* * * * *

UNITED STATES PATENT AND TRADEMARK OFFICE
CERTIFICATE OF CORRECTION

PATENT NO. : 6,921,710 B2
DATED : July 26, 2005
INVENTOR(S) : Weimin Li et al.

It is certified that error appears in the above-identified patent and that said Letters Patent is hereby corrected as shown below:

Column 10,
Line 34, delete "(methylcyclopentadienyl" and insert -- (methylcyclopentadienyl) --.

Signed and Sealed this

Thirty-first Day of January, 2006

JON W. DUDAS
*Director of the United States Patent and Trademark Office*